United States Patent
Endo et al.

(10) Patent No.: US 7,879,529 B2
(45) Date of Patent: *Feb. 1, 2011

(54) MATERIAL FOR FORMATION OF RESIST PROTECTION FILM AND METHOD OF FORMING RESIST PATTERN THEREWITH

(75) Inventors: Kotaro Endo, Kawasaki (JP); Masaaki Yoshida, Kawasaki (JP); Keita Ishizuka, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 187 days.

This patent is subject to a terminal disclaimer.

(21) Appl. No.: 11/658,900

(22) PCT Filed: Jul. 29, 2005

(86) PCT No.: PCT/JP2005/013975

§ 371 (c)(1),
(2), (4) Date: May 1, 2008

(87) PCT Pub. No.: WO2006/011606

PCT Pub. Date: Feb. 2, 2006

(65) Prior Publication Data

US 2008/0311523 A1 Dec. 18, 2008

(30) Foreign Application Priority Data

Jul. 30, 2004 (JP) .............................. 2004-224810
Aug. 4, 2004 (JP) .............................. 2004-228695

(51) Int. Cl.
G03F 7/11 (2006.01)
G03F 7/26 (2006.01)
C07D 265/00 (2006.01)
C07D 285/00 (2006.01)

(52) U.S. Cl. ..................... 430/271.1; 430/322; 430/330; 430/273.1; 548/123; 548/125; 549/9; 549/14

(58) Field of Classification Search .............. 430/270.1, 430/271.1, 908, 322, 330; 548/123, 125; 549/9, 14, 29; 526/213, 216
See application file for complete search history.

(56) References Cited

U.S. PATENT DOCUMENTS

| | | | | | |
|---|---|---|---|---|---|
| 4,387,222 | A | * | 6/1983 | Koshar | ............................ 544/4 |
| 5,631,314 | A | * | 5/1997 | Wakiya et al. | .............. 524/165 |
| 5,750,312 | A | | 5/1998 | Chandross et al. | |
| 6,555,510 | B2 | * | 4/2003 | Lamanna et al. | ............. 510/175 |
| 6,639,035 | B1 | | 10/2003 | Chen et al. | |
| 2001/0049073 | A1 | | 12/2001 | Hada et al. | |
| 2003/0129504 | A1 | * | 7/2003 | Wakata et al. | ................... 430/5 |
| 2003/0219682 | A1 | | 11/2003 | Wakiya et al. | |
| 2004/0142280 | A1 | * | 7/2004 | Iwanaga et al. | ......... 430/281.1 |
| 2005/0202351 | A1 | * | 9/2005 | Houlihan et al. | ............ 430/322 |
| 2005/0250898 | A1 | * | 11/2005 | Maeda et al. | ............... 524/544 |
| 2007/0269734 | A1 | | 11/2007 | Kimura et al. | |
| 2008/0299503 | A1 | * | 12/2008 | Ishiduka et al. | ............. 430/325 |
| 2008/0311523 | A1 | | 12/2008 | Endo et al. | |
| 2009/0197199 | A1 | * | 8/2009 | Ishizuka et al. | .......... 430/273.1 |

FOREIGN PATENT DOCUMENTS

| | | | |
|---|---|---|---|
| EP | 0476840 | A1 | 3/1992 |
| EP | 1266922 | | 12/2002 |
| JP | 5-029212 | | 2/1993 |
| JP | 05-132451 | * | 5/1993 |
| JP | 8-254834 | | 10/1996 |
| JP | H11-176727 | | 7/1999 |
| JP | 2004-077653 | | 3/2004 |
| JP | 4368266 | B2 | 9/2009 |
| KR | 2002-0070793 | | 9/2002 |
| KR | 2003-0051419 | | 6/2003 |
| KR | 2004-0050884 | | 6/2004 |
| TW | 200609682 | | 7/2005 |
| TW | 200535566 | | 11/2005 |
| TW | 200609683 | | 3/2006 |
| WO | WO 03/069410 | * | 8/2003 |
| WO | WO 2004/074937 | A1 | 9/2004 |
| WO | WO 2005/069076 | A1 | 7/2005 |

OTHER PUBLICATIONS

The Extended European search report issued to counterpart European Patent Application No. 05767298.2, mailed Jun. 30, 2009.
Yoshida, Masaaki et al. "Development Status of High Performance Materials for Immersion Lithography" Journal of Photopolymer Science and Technology, Chiba, JP, vol. 17, No. 4, pp. 603-607, 2004.
Office Action issued to counterpart Taiwanese Patent Application No. 094126058, mailed Jun. 24, 2009.

(Continued)

*Primary Examiner*—Cynthia H Kelly
*Assistant Examiner*—Anca Eoff
(74) *Attorney, Agent, or Firm*—Knobbe, Martens, Olson & Bear, LLP

(57) ABSTRACT

In the liquid immersion lithography process, by simultaneously preventing deterioration of a resist film and deterioration of an immersion liquid employed during liquid immersion lithography which uses various immersion liquids, including water, resistance to post exposure delay of the resist film can be improved without increasing the number of processes, thereby making it possible to form a high resolution resist pattern using liquid immersion lithography. Furthermore, it is possible to apply a high refractive index liquid immersion medium, used in combination with the high refractive index liquid immersion medium, thus making it possible to further improve pattern accuracy. Using a composition comprising an acrylic resin component having characteristics which have substantially no compatibility with a liquid in which a resist film is immersed, particularly water, and are also soluble in alkaline, a protective film is formed on the surface of a resist film used.

20 Claims, No Drawings

OTHER PUBLICATIONS

Office Action issued in counterpart Korean Patent Application No. 10-2008-7018134, mailed Mar. 17, 2009.

Office Action issued in counterpart Taiwanese Application No. 094126058, mailed Feb. 24, 2009.

Notice of Reasons for Rejection issued to corresponding Taiwan Application No. 094126058, mailed Apr. 13, 2010.

International Search Report, International Application No. PCT/JP2005/013975, date mailed Oct. 25, 2005.

J. A. Hoffnagle et al., "Liquid Immersion Deep-Ultraviolet Interferometric Lithography," Journal of Vacuum Science & Technology B, Nov./Dec. 1999, pp. 3306-3309, vol. 17, No. 6, American Vacuum Society.

M. Switkes et al., "Immersion Lithography at 157 nm," Journal of Vacuum Science & Technology B, Nov./Dec. 2001, pp. 2353-2356, vol. 19, No. 6, American Vacuum Society.

M. Switkes et al., "Resolution Enhancement of 157 nm Lithography by Liquid Immersion," Proceedings of SPIE, 2002, pp. 459-465, vol. 4691.

* cited by examiner

MATERIAL FOR FORMATION OF RESIST PROTECTION FILM AND METHOD OF FORMING RESIST PATTERN THEREWITH

CROSS REFERENCE TO RELATED APPLICATIONS

This application is a national phase of International Application No. PCT/JP2005/013975 entitled, "Material for Formation of Resist Protection Film and Method of Forming Resist Pattern Therewith," filed on Jul. 29, 2005, which was not published in English, which is based on and claims the benefit of priority from Japanese Patent Application No. 2004-224810, filed on 30 Jul. 2004, and Japanese Patent Application No. 2004-228695, filed on 4 Aug. 2004.

TECHNICAL FIELD

The present invention relates to a material for forming a resist protective film, and a method for forming a resist pattern using such an immersion liquid. Particularly, the present invention relates to a material for forming a resist protective film which can be suitably used in a liquid lithography process by which the resolution of a resist pattern on at least a resist film on a route of allowing lithographic exposure light to reach to the resist film by exposing the above resist film, while being intervened by a liquid having a predetermined thickness and refractive index which is larger than that of an air and smaller than that of the resist film, and to a method for forming a resist pattern using such an immersion liquid.

BACKGROUND ART

Lithography methods have been frequently used for the production of fine structures in various kinds of electronic devices, such as semiconductor devices and liquid crystal devices. However, as the device structures are miniaturized, resist patterns in lithography processes are also desired to be miniaturized.

In the advanced field, for example, a lithography process now allows the formation of a fine resist pattern having a line width of about 90 nm. However, finer pattern formation will be required in future.

For attaining the formation of such a fine pattern having a line width of less than 90 nm, a first point is to develop an aligner and a resist corresponding thereto. Common factors to consider for developing the aligner include shortening of wavelengths of optical sources such as F2 excimer laser, EUV (extreme UV light), electron beam, X-ray, and soft X-ray, and increases in numerical aperture (NA) of lens.

However, the shortening of optical wavelength may require a new expensive aligner. In addition, even the resolution increases, a disadvantage of lowering a focal depth width occurs at high NA due to a trade-off relationship between the resolution and the focal depth width.

Recently, as a lithography technology for allowing such problems to be solved, a method known as a liquid immersion lithography process has been reported (e.g., Non-Patent Documents 1, 2, and 3). In this process, liquid refractive index media such as pure water or a fluorine-based inert liquid (refractive index liquid, and immersion liquid) lies in predetermined thickness on at least a resist film between a lens and the resist film. In this method, the space of an exposure light path conventionally filled with inert gas such as air or nitrogen is replaced with a liquid having a larger refractive index (n), for example pure water to attain high resolution without a decrease in focal depth width in a manner similar to the use of a light source of shorter wavelength or a high NA lens even if the optical source having the same exposure wavelength is employed.

Such liquid immersion lithography has been remarkably noticed because the use thereof allows a lens implemented in the existing device to realize the formation of a resist pattern excellent in higher resolution property as well as excellent in focal depth in low costs.

(Non Patent Document 1) Journal of Vacuum Science & Technology B (J. Vac. Sci. Technol. B) (Issued country: U.S.A.), vol. 17, No. 6, pages 3306-3309, 1999.

(Non Patent Document 2) Journal of Vacuum Science & Technology B (J. Vac. Sci. Technol. B) (Issued country: U.S.A.), vol. 19, No. 6, pages 2353-2356, 2001.

(Non Patent Document 3) Proceedings of SPIE (Issued country: U.S.A.), Vol. 4691, pages 459-465, 2002.

DISCLOSURE OF THE INVENTION

However, in the abovementioned liquid immersion lithography process, since a resist film is directly brought into contact with a refractive index liquid (immersion liquid) at the time of exposure, the resist film is permeated by the liquid. Therefore, it is necessary to examine whether or not a conventionally used resist composition should be applied in such a manner.

The resist composition which is conventionally used at present is a composition which has already been widely studied and established as a possible resin having important essential characteristics such as transparency to exposure light. The present inventors have studied by various tests so as to obtain a resist composition having characteristics suited for liquid immersion lithography with slightly or no adjusting the compositions proposed at present. As a result, the existence of a resist composition that is able to meet the abovementioned expectations from a practical standpoint was revealed. It has also been confirmed that even in cases in which deterioration due to a liquid occurs in a resist composition, and a sufficient resolution pattern is not obtained during liquid immersion lithography, there are many resist compositions which exhibit fine and high resolution in lithography by exposure via a conventional air layer. Such a resist composition is a composition attained by consuming a lot of development resources and is a composition which is excellent in various resist characteristics such as transparency to exposure light, developing properties, and storage stability, and such a resist composition include any of compositions which is inferior only in resistance to an immersion liquid. Some examples of a composition, which is not suited for liquid immersion lithography but exhibits high resolution in lithography in an air layer, are shown in the examples and comparative examples of the present invention, described hereinafter.

It has been confirmed that, even when using resist film suited for liquid immersion lithography, the quality and amount of non-defective products are lowered as compared with exposure via an air layer when liquid immersion lithography is conducted.

The adequacy of a resist film to liquid immersion lithography can be evaluated on the basis of the following assay.

In other words, for evaluating the abilities of liquid immersion lithography to form resist patterns, it is considered sufficient to confirm the following three items: (i) the capabilities of an optical system based on the liquid immersion lithography process; (ii) influences of a resist film on an immersion liquid, and (iii) denaturation of the resist film by the immersion liquid.

In principle, as long as no light propagation loss, such as light reflection on the surface of water and the boundary of water with the surface of a photographic plate occurs, no problem occurs with respect to the above item (i). It is evident from assuming, for example, cases in which the photographic plate having a water-proof surface is immersed into water and the surface is then exposed to patterning light. In this case, the light propagation loss can be easily settled by adequately defining an incident angle of exposure light. Therefore, regardless of a resist film, a photographic plate, or an image formation screen, which is provided as an exposure target, no variation may occur in optical properties as long as each of them is inactive to an immersion liquid, or as long as those are prevented from any influence from the immersion liquid and exerting no influence on the immersion liquid. Therefore, the present item does not require any additional conformation experiment.

With respect to item (ii), the immersion liquid influences the resist film, specifically by allowing the components of the resist film to escape into the liquid, to change the refractive index of the immersion liquid. A change in the refractive index of the immersion liquid may lead to a change in the optical resolution properties of the pattern exposure. This is true based on theory without any experimentation. Thus, the present item can be sufficiently confirmed from the fact that the components of the immersion liquid escape into the immersion liquid, the composition of the immersion liquid is changed, or the refractive index is changed when it is immersed therein. Therefore, it is not necessary to confirm the resolution by actually carrying out irradiation of patterning light and development.

Conversely, when the resist film in the immersed liquid is exposed to patterning light and then developed to confirm its resolution properties, the quality of the resolution may be confirmed. However, it is hardly defined as to whether the cause is related to any influence of deterioration in the quality of the immersion liquid on the resolution properties thereof, any influence on the deterioration in the quality of the resist material on the resolution properties thereof, or both.

With respect to the item (iii) where the resolution properties of the resist film is deteriorated by deterioration of the resist film in the immersion liquid, it is sufficient to carry out an evaluation test for "performing a process of showering the resist film with the immersion liquid after exposure and then carrying out development, followed by testing the resolution properties of the resulting resist patterns". Besides, in this evaluation process, the immersion liquid is directly poured on the resist film, so that the conditions of liquid immersion may be more severe. With respect to such a fact, when the test of exposure in complete immersion is carried out, a cause of a change in resolution properties is hardly defined whether it is due to an influence of deterioration of the immersion liquid, an influence of deterioration of the resist film with the immersion liquid, or both influences.

The above phenomena (ii) and (iii) are one and the same, so that these phenomena can be figured out by confirming the degree of deterioration of the resist film with the immersion liquid.

Based on such an analysis, the suitability of the presently-proposed resist film to liquid immersion lithography as described above can be confirmed by an evaluation test of "performing a process of showering the resist film with the immersion liquid after exposure and then carrying out development, followed by testing the resolution properties of the resulting resist patterns". Furthermore, it can be also confirmed by carrying out an evaluation test that simulates an actual production process with a "two-beam interference process" using interference light through a prism instead of exposure patterning light and placing a sample in liquid immersion, followed by developing an image.

As described above, a lot of developmental resources are required so as to produce a new resist film suited for liquid immersion lithography. Also it has been confirmed that, among currently proposed resist compositions, there exists a resist composition having characteristics suited for liquid immersion lithography with slightly or no adjusting the composition, although the quality slightly deteriorates, and that even in case of a resist composition in which deterioration due to an immersion liquid occurs and therefore sufficient pattern resolution is not obtained in liquid immersion lithography, there exist a lot of resist compositions which exhibit fine and high resolution in lithography by exposure via a conventional air layer.

In light of these problems of the prior art, the present invention has been made and an object thereof is to provide a technique which can also apply a resist film obtained from a conventional resist composition attained by consuming a lot of development resources for liquid immersion lithography and, specifically, an object of simultaneously preventing deterioration of a resist film and deterioration of a liquid used during liquid immersion lithography by forming a specific protective film on the surface of a conventional resist film, thereby making it possible to form a high resolution resist pattern using liquid immersion lithography.

Furthermore, in the present invention, the following object is also achieved.

Although water is presently desired as a refractive index liquid for liquid immersion lithography in view of the ease of handling, the use a liquid immersion medium having a higher refractive index than that of water is anticipated in the near future, so as to obtain a high resolution in a liquid immersion lithography system. Considering the relationship between the liquid immersion medium and the resist protective film, as is apparent from an angle of approach of light at the interface, the refractive index must be identical to or higher than that of the liquid immersion medium (for example, water) located thereon. Thus, it is important to develop a resist protective film material having high refractive index characteristics which can also be used in the "liquid immersion medium having a higher refractive index than that of water," which is expected to be used in the near future. An object of the present invention is to provide a protective film material having high refractive index characteristics, which can be used as a protective film material, even when using a liquid immersion medium having a higher refractive index (1.5 or more to exposure light having a wavelength of 193 nm) than the refractive index (about 1.44 to exposure light having a wavelength of 193 nm) of water.

To achieve the above object, the material for forming a protective film as an upper layer on a resist film of the present invention is a material including at least an acrylic polymer and a solvent, the material being soluble in alkaline. The material with such a constitution is suited for use as a material which forms a protective film of a common resist film, and also can exhibit excellent characteristics when applied for a material used in a liquid immersion lithography system.

Furthermore, a resist pattern forming method of the present invention is a resist pattern forming method using a liquid immersion lithography process, which includes the steps of forming a resist film on a substrate; forming a protective film, which has no substantial compatibility with water and also has the characteristic of being soluble in alkaline, on the resist film using the material for forming a resist protective film; directly placing a liquid for the liquid immersion lithography having a predetermined thickness on at least the protective film of the substrate on which the resist film and the protective film are laminated; irradiating the resist film with predetermined pattern light via the liquid for liquid immersion lithography and the protective film, and optionally subjecting the film to a heat treatment; and washing the protective film and the resist film with an alkaline developing solution, thereby removing the protective film and developing the resist film to obtain a resist pattern.

The liquid immersion lithography process preferably have a construction which can be suitably used in a liquid lithography process by which the resolution of a resist pattern on at least a resist film on a route of allowing lithographic exposure light to reach to the resist film by exposing the above resist film, while being intervened by a liquid having a predetermined thickness and refractive index which is larger than that of an air and smaller than that of the resist film.

The acrylic polymer comprises at least a structural unit represented by the following general formula (1):

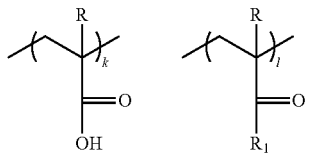

wherein R is selected from a hydrogen atom, a methyl group and a hydroxyalkyl group having 1 to 5 carbon atoms; $R_1$ represents a substituent having at least one alicyclic structure; and k and l represent the content (mol %) of each constituent unit, and are respectively from 5 to 95 mol %, as a constituent unit, More preferably, an acrylic polymer comprises at least a constituent unit represented by the following general formula (2):

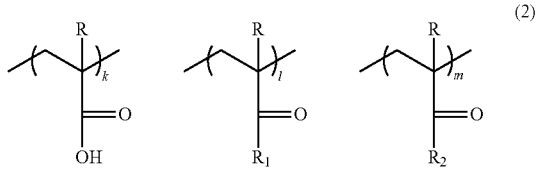

wherein R is selected from a hydrogen atom, a methyl group and a hydroxyalkyl group having 1 to 5 carbon atoms; $R_1$ represents a substituent having at least one alicyclic structure; $R_2$ represents substituted or unsubstituted, branched or linear alkyl group having 1 to 5 carbon atoms; and k, l and m represent the content (mol %) of each constituent unit and are respectively from 5 to 90 mol %, obtained by adding a third constituent unit to a constituent unit represented by the general formula (1).

The polymer is soluble in an alcoholic solvent, can form a film by way of a spin coater, causes neither swelling nor thickness loss to pure water during the time of liquid immersion lithography, and is also soluble in an alkaline developing solution. That is, the polymer is highly suited for use as a resist protective film material for liquid immersion lithography. Moreover, this polymer has a high refractive index of 1.6655 (absorption coefficient=0.0016) when permeated by light having a wavelength of 193.

Thus, the film formed by using the acryl polymer has a suitable contact angle. As an additional characteristic of a protective film used for liquid immersion lithography, it is necessary for a contact angle of a liquid immersion solvent to have a predetermined value. The reason is as follows: if the contact angle is too large when a liquid immersion solvent is placed on a protective film, the liquid immersion solvent is repelled, and therefore, the physical stability of the liquid immersion solvent as a refractive index medium deteriorates. On the other hand, when if the contact angle is too small, the amount of the liquid immersion solvent adhered on the protective film increases, and not only does it require a long time to wash after the completion of a liquid immersion lithography treatment, but also unnecessary discharge of the liquid immersion medium out of the system (hereinafter referred to as "medium leakage") occurs, resulting in poor efficiency.

Furthermore, in the present invention, when forming a resist protective film, an acidic compound is preferably added as a component, so as to prevent pattern deterioration by an environmental amine component of a photosensitive resin layer after the exposure. As the acidic compound, a fluorocarbon compound described hereinafter is preferably used.

The material of the present invention can be directly formed on a resist film and does not inhibit pattern exposure. The material of the present invention is so insoluble in water that it becomes possible to actually use "water (pure water or deionized water), which is generally employed as an immersion liquid for liquid immersion lithography because of the optical requirements of liquid immersion lithography, ease of handling and free from environmental pollution" as an immersion liquid for liquid immersion lithography. In other words, even when water, which is easily handled, has good refractive index characteristics and free from environmental pollution, is used as the immersion liquid for liquid immersion lithography, it is possible to sufficiently protect resist films having various compositions during the liquid immersion lithography process to obtain a resist pattern having good characteristics. Also, when an exposure wavelength of 157 nm is used, a fluorine-based medium is expected as the immersion liquid for liquid immersion lithography in view of absorption of exposure light. However, when such as fluorine-based solvent is used, it is impossible to sufficiently protect a resist film when being subjected to the liquid immersion lithography process to obtain a resist pattern having good characteristics, similar to water. Furthermore, since the material of the present invention is soluble in alkaline, it is not necessary to remove the protective film formed from the resist film before a development treatment even when the development treatment is conducted after the completion of the exposure. Namely, since the protective film obtained by using the material of the present invention is soluble in alkaline, it is not necessary to provide a protective film removing process before the development process after exposure, and the development treatment of the resist film with an alkaline developing solution can be conducted without removing the protective film, thereby making it possible to simultaneously conduct the removal of the protective film and the development of the resist film. Thus, according to a pattern forming method, which is conducted using the material of the present invention, a resist film having good pattern characteristics can be efficiently formed in fewer processes, without causing any environmental pollution.

Furthermore, the material of the present invention has a high refractive index and therefore can be preferably used as a material for forming a resist protective film in liquid immersion lithography using a high refractive index liquid immersion medium which is expected to be developed in near future.

As described above, a specific fluorocarbon compound described hereinafter is preferably added as an acidic component, in forming a protective film. The effect of improving coatability when coating a material for forming a resist protective film in the form of a coating solution on a resist film is also obtained by the addition of this specific fluorocarbon compound. More importantly, when a protective film containing this specific fluorocarbon compound added therein is used, it is possible to further improve resistance to post exposure delay in an atmosphere containing a trace amount of amine after pattern exposure of a resist film.

Resistance to post exposure delay will now be briefly described. That is, a trace amount (ppb) of amine is contained in an atmosphere whereby the exposure and development processes of a conventional resist are carried out. It is known that when this amine is brought into contact with a resist film after the exposure process, the size of a pattern obtained by the following development process varies. In cases where the size of a resist pattern obtained by the following development process does not vary drastically, even when a resist is subsequently exposed in an atmosphere containing a trace amount of amine after exposure, it is considered that the resist film has excellent resistance to post exposure delay.

The present invention has a feature that, by adding a specific fluorocarbon compound described hereinafter to a protective film, the protective film has characteristics capable of protecting a resist film after the exposure from an action of amine.

PREFERRED MODE FOR CARRYING OUT THE INVENTION

In the present invention with the above constitution, liquid immersion lithography can be conducted by using, as a liquid for liquid immersion lithography, water composed substantially of pure water or deionized water, or a fluorine-based inert liquid. As described previously, taking into account the cost, the ease of post-treatment and the reduction in environmental pollution, water is a more preferable liquid for liquid immersion lithography. When exposure light having a wavelength of 157 nm is used, it is preferable to use a fluorine-based solvent which causes less absorption of exposure light. Furthermore, the protective film formed by the material of the present invention can have a high refractive index to exposure light, more than 1.6, and therefore, it is possible to use a high refractive index liquid immersion medium which is expected to be developed in near future.

The resist film, which can be used in the present invention, may be any resist film obtained by using a conventional common resist composition, and is not specifically limited. This is also a primary feature of the present invention.

As described above, the essential characteristics of a protective film of the present invention are as follows, that is, it has substantially no compatibility with water, is soluble in alkaline, transparent to exposure light, does not promote mixing with a resist film, exhibits good adhesion to a resist film and good compatibility with a developing solution, and also has a high refractive index and a large contact angle. As the material having these characteristics, a composition can be used which is prepared by dissolving an acrylic polymer in a solvent which has no compatibility with a resist film and can dissolve the acrylic polymer.

The acrylic polymer as a base polymer of the protective film of the present invention is a polymer having a constituent unit represented by the general formula (1) and is more preferably a polymer having a constituent unit represented by the general formula (2).

In these general formulas, the substituent R is at least one selected from hydrogen atom, methyl group and hydroxyalkyl group.

The substituent $R_1$ is preferably a hydrocarbon group having at least one alicyclic structure; and specific examples of the hydrocarbon group include cyclohexyl group, adamantyl group, norbornyl group, isobornyl group, tricyclodecyl group and tetracyclododecyl group substituted with a hydroxyl group or not. Among these groups, at least one group selected from cyclohexyl group and tricyclodecyl group is preferable.

Furthermore, the substituent $R_2$ includes an alkyl group having 1 to 5 carbon atoms and a hydroxyalkyl group. Among these substituents, at least one group selected from n-butyl group and isobutyl group is preferable.

More specifically, such an acryl polymer is a polymer having a constituent unit represented by the following general formula (3):

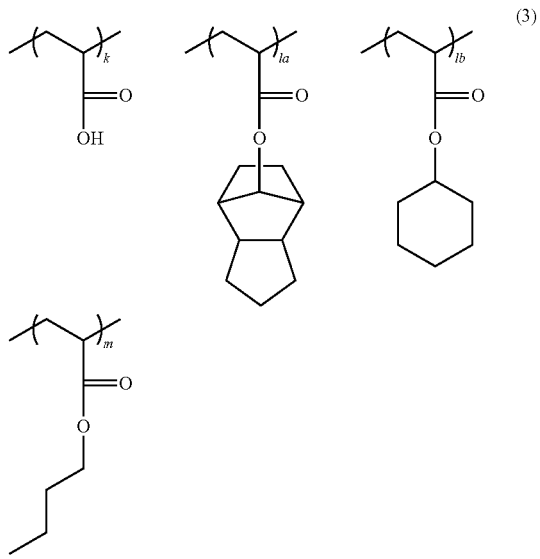

wherein k, la, lb and m represent the content (mol %) of each constituent unit, and are respectively from 5 to 50 mol %, and la+lb represents mol % corresponding to 1 in the general formulas (1) and (2).

Among the constituent unit represented by the general formula (3), an acryl constituent unit at the left end, which accounts for k mol %, is a component which mainly contributes to alkaline solubility of the present acrylic polymer. Also, a constituent unit having two kinds of central alicyclic structures, which account for la mol % and lb mol %, is a component which mainly contributes to a contact angle of the present acrylic polymer. Also, a constituent unit at the right end, which accounts for m mol %, is a component which mainly contributes to properties of a coating film of the present acrylic polymer. Therefore, in the present invention, it is possible to obtain a material for forming a resist protective film, which is best suited for use conditions, by appropriately controlling k mol % of the component capable of contributing to alkaline solubility, l (la+lb) mol % of the component capable of contributing to a contact angle and m mol % of the component capable of contributing to coatability. Although each mol % may slightly vary depending on the use conditions, k is preferably from 5 to 90 mol %, l (=la+lb) is preferably from 5 to 90 mol %, and m is preferably from 5 to 90 mol %.

Such a polymer can be synthesized by a known method. Also, a polystyrene equivalent weight average molecular weight determined by GPC of the resin polymer component is not specifically limited, and is from 3,000 to 50,000.

As the solvent which dissolves the acrylic polymer, any solvent that is not compatibility with a resist film and capable of dissolving the fluoropolymer can be used. Examples of such a solvent include alcoholic solvent, paraffinic solvent and fluorine-based solvent. As the alcoholic solvent, a common alcoholic solvent such as isopropyl alcohol, 1-hexanol, 2-methyl-1-propanol (isobutanol) or 4-methyl-2-pentanol can be used, and 2-methyl-1-propanol and 4-methyl-2-pentanol are particularly preferable. It has been confirmed that n-heptane can be used as a paraffinic solvent and perfluoro-2-butyltetrahydrofuran can be used as a fluorine-based solvent. Among these solvents, an alcoholic solvent is preferable in view of alkaline solubility upon development.

As described above, the material of the present invention contains a fluorocarbon compound as an acidic component. The reason is, even when a resist film is allowed to stand in an atmosphere containing a trace amount of amine before development after being subjecting to liquid immersion lithography, in addition to having characteristics which enable to inhibit an adverse influence of amine. Thus, the size of a resist pattern obtained by the development after being allowed to stand does not vary drastically.

The fluorocarbon compound, which exerts the above action, and the fluorocarbon compound is not an object of Significant New Use Rule (SNUR) and is a usable chemical substance.

Such a fluorocarbon compound is preferably a fluorocarbon compound represented by the following general formula (4):

$$(C_nF_{2n+1}SO_2)_2NH \quad (4)$$

wherein n represents an integer of 1 to 5;
a fluorocarbon compound represented by the following general formula (5):

$$C_mF_{2m+1}COOH \quad (5)$$

wherein m represents an integer of 10 to 15;
a fluorocarbon compound represented by the following general formula (6):

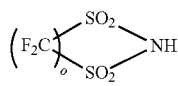

(6)

wherein o represents an integer of 2 to 3; and
a fluorocarbon compound represented by the following general formula (7):

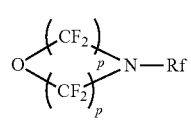

(7)

wherein p represents an integer of 2 to 3; and Rf represents an alkyl group in which a portion or all of hydrogen atoms are substituted with a fluorine atom, and may be substituted with a group selected from a hydroxyl group, an alkoxy group, a carboxyl group or an amino group.

Specifically, the fluorocarbon compound represented by the general formula (4) is preferably a compound represented by the following chemical formula (8):

$$(C_4F_9SO_2)_2NH \quad (8)$$

or a fluorocarbon compound represented by the following chemical formula (9):

$$(C_3F_7SO_2)_2NH \quad (9)$$

Specifically, the fluorocarbon compound represented by the general formula (5) is preferably a fluorocarbon compound represented by the following chemical formula (10):

$$C_{10}F_{21}COOH \quad (10)$$

Specifically, the fluorocarbon compound represented by the general formula (6) is preferably a fluorocarbon compound represented by the following chemical formula (11):

(11)

Specifically, the fluorocarbon compound represented by the general formula (7) is preferably a fluorocarbon compound represented by the following chemical formula (12):

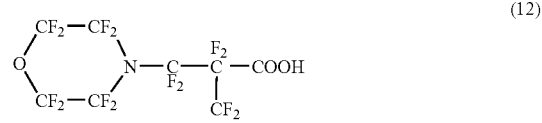

(12)

The protective film of the present invention is nonaqueous and also exhibits high resistance to the other immersion liquids, and therefore can be applied to a resist film with any composition, including a resist film having low resistance to an immersion liquid. Therefore, as the resist film material of the present invention, any known resist can be used and a common positive photoresist and a negative photoresist can be used. These specific examples are shown below.

First, as a resin component used in a positive photoresist, a fluorine-based resin, an acrylic resin, a cycloolefin-based resin and silsesquioxane-based resin are used.

The fluorine-based resin is preferably a polymer which has an alkaline-soluble constituent unit (a0-1), including an aliphatic cyclic group having both (A) (i) a fluorine atom or a fluorinated alkyl group, and (ii) an alcoholic hydroxyl group or an alkyloxy group, and alkaline solubility of which varies with an action of an acid.

The above phrase "alkaline solubility varying with acid action" means a variation of the polymer in the exposed area. When alkaline solubility increases in the exposed area, the exposed area becomes soluble in alkaline and therefore the polymer is used as a positive photoresist. On the other hand, when alkaline solubility decreases in the exposed area, the exposed area becomes alkaline insoluble, and therefore the polymer is used as a negative photoresist.

The alkaline-soluble constituent unit (a0-1) including an aliphatic cyclic group having both (i) a fluorine atom or a fluorinated alkyl group, and (ii) an alcoholic hydroxyl group or an alkyloxy group, may be a constituent unit wherein an organic group having both (i) and (ii) is bonded with an aliphatic cyclic group and the cyclic group is included in a constituent unit.

Examples of the aliphatic cyclic group include a group wherein one or plural hydrogen atoms are eliminated from a monocyclic or polycyclic hydrocarbon such as cyclopentane, cyclohexane, bicycloalkane, tricycloalkane or tetracycloalkane. More specifically, a polycyclic hydrocarbon includes a group wherein one or plural hydrogen atoms are eliminated from a polycycloalkane such as adamantane, norbornane, isobornane, tricyclodecane or tetracyclododecane. Among these groups, a group derived by eliminating hydrogen atoms from cyclopentane, cyclohexane or norbornane is preferable from an industrial point of view.

Examples of the fluorine atom or fluorinated alkyl group (i) include a fluorine atom, or a group wherein a portion or all of hydrogen atoms of a lower alkyl group are substituted with a fluorine atom. Specific examples thereof include trifluoromethyl group, pentafluoroethyl group, heptafluoropropyl group and nonafluorobutyl group, and fluorine atom and trifluoromethyl group are preferable from an industrial point of view.

The alcoholic hydroxyl group or alkyloxy group (ii) may be merely a hydroxyl group, and examples thereof include alcoholic hydroxyl group-containing alkyloxy group, alcoholic hydroxyl group-containing alkyloxyalkyl group, or alcoholic hydroxyl group-containing alkyl group, such as alkyloxy group having a hydroxy group, alkyloxyalkyl group or alkyl group. Examples of the alkyloxy group, alkyloxyalkyl group and alkyl group include lower alkyloxy group, lower alkyloxylower alkyl group and lower alkyl group.

Specific examples of the lower alkyloxy group include methyloxy group, ethyloxy group, propyloxy group and butyloxy group, specific examples of the lower alkyloxylower alkyl group include methyloxymethyl group, ethyloxymethyl group, propyloxymethyl group and butyloxymethyl group, and specific examples of the lower alkyl group include methyl group, ethyl group, propyl group and butyl group.

Also, a portion or all of hydrogen atoms of the alkyloxy group, alkyloxyalkyl group, or alkyl group in (i) the alcoholic hydroxyl group-containing alkyloxy group, alcoholic hydroxyl group-containing alkyloxyalkyl group, or alcoholic hydroxyl group-containing alkyl group may be substituted with a fluorine atom. Preferably, a portion of hydrogen atoms of the alkyloxy moiety in the alcoholic hydroxyl group-containing alkyloxy group or alcoholic hydroxyl group-containing alkyloxyalkyl group are substituted with a fluorine atom and, in the alcoholic hydroxyl group-containing alkyl group, a group wherein a portion of hydrogen atoms of the alkyl group are substituted with a fluorine atom, that is, an alcoholic hydroxyl group-containing fluoroalkyloxy group, an alcoholic hydroxyl group-containing fluoroalkyloxyalkyl group or an alcoholic hydroxyl group-containing fluoroalkyl group is exemplified.

Examples of the alcoholic hydroxyl group-containing fluoroalkyloxy group include (HO)C(CF$_3$)$_2$CH$_2$O— group (2-bis(hexafluoromethyl)-2-hydroxy-ethyloxy group) and (HO)C(CF$_3$)$_2$CH$_2$CH$_2$O— group (3-bis(hexafluoromethyl)-3-hydroxy-propyloxy group), examples of the alcoholic hydroxyl group-containing fluoroalkyloxyalkyl group include (HO)C(CF$_3$)$_2$CH$_2$O—CH$_2$— group and (HO)C(CF$_3$)$_2$CH$_2$CH$_2$O—CH$_2$— group, and examples of the alcoholic hydroxyl group-containing fluoroalkyl group include (HO)C(CF$_3$)$_2$CH$_2$— group (2-bis(hexafluoromethyl)-2-hydroxy-ethyl group) and (HO)C(CF$_3$)$_2$CH$_2$CH$_2$— group (3-bis(hexafluoromethyl)-3-hydroxy-propyl group).

It is preferable that these groups (i) and (ii) are directly bonded with the aliphatic cyclic group. The constituent unit (a0-1) is preferably a unit represented by the following general formula (13) formed by bonding an alcoholic hydroxyl group-containing fluoroalkyloxy group, an alcoholic hydroxyl group-containing fluoroalkyloxyalkyl group or an alcoholic hydroxyl group-containing fluoroalkyl group with a norbornene ring and cleaving a double bond of the norbornene ring because it is excellent in transparency, alkaline solubility and dry etching resistance and is easily available.

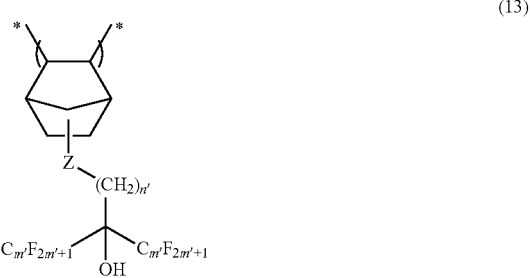

(13)

In the general formula (13), Z is selected from an oxygen atom, an oxymethylene group (—O(CH$_2$)—), and a single bond; and n' and m' each independently represents an integer of 1 to 5.

The polymer unit used in combination with the unit (a0-1) is not limited as long as it is a known polymer unit. When a positive polymer (A-1) is used, wherein alkaline solubility increases by an action of acid, it is preferable because the constituent unit (a0-2) derived from a (meth)acryl ester having a known acid dissociable dissolution inhibiting group is excellent in resolution.

Such a constituent unit (a0-2) includes, for example, a constituent unit derived from a tertiary alkyl ester of (meth)acrylic acid, such as tert-butyl(meth)acrylate or tert-amyl (meth)acrylate.

The polymer (A) may be a polymer (A-2) further comprising a fluorinated alkylene constituent unit (a0-3) capable of improving transparency of a polymer, wherein alkaline solubility increases by an action of an acid. Transparency is further improved by containing such a constituent unit (a0-3). The constituent unit (a0-3) is preferably a unit derived from tetrafluoroethylene.

The general formulas (14) and (15), which represent a polymer (A-1) and a polymer (A-2), are shown below.

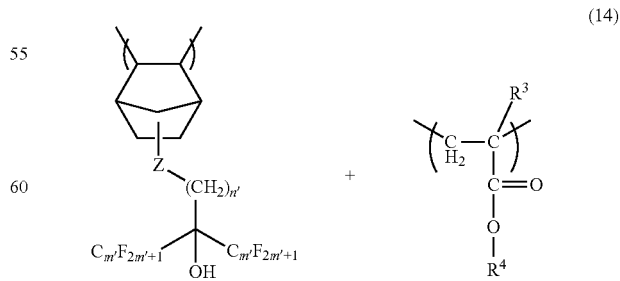

(14)

In the general formula (14), Z, n' and m' are as defined in the abovementioned general formula (13); R$^3$ is selected from a hydrogen atom and a methyl group; and $R^4$ represents an acid dissociable dissolution inhibiting group.

(15)

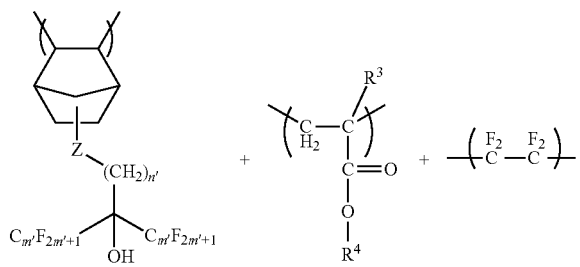

In the general formula (15), Z, n', m', $R^3$ and $R^4$ are as defined the abovementioned general formula (14).

The polymer (A-1) and the polymer (A-2), which contain the abovementioned general formula (13), have a different structural formula, but may have the following constituent unit comprising an alkaline-soluble constituent unit (a0-1) including an aliphatic cyclic group having both (i) a fluorine atom or a fluorinated alkyl group, and (ii) an alcoholic hydroxyl group or an alkyloxy group included in the concept of a polymer wherein alkaline solubility varies with an action of an acid.

Accordingly, in the constituent unit (a0-1), (i) a fluorine atom or a fluorinated alkyl group, and (ii) an alcoholic hydroxyl group are respectively bonded on an aliphatic ring and the cyclic group constitutes a main chain. The fluorine atom or fluorinated alkyl group (i) includes the same one as described above. Also, the alcoholic hydroxyl group (ii) is merely a hydroxyl group.

The polymer (A) having such a unit is formed by cyclic polymerization of a diene compound having a hydroxyl group and a fluorine atom. The diene compound is preferably heptadiene capable of easily forming a polymer having a 5- or 6-membered ring, which is excellent in transparency and dry etching resistance. Furthermore, a polymer formed by cyclic polymerization of 1,2,3,3-pentafluoro-4-trifluoromethyl-4-hydroxy-1,6-heptadiene $(CF_2\!=\!CFCF_2C(CF_3)(OH)CH_2CH\!=\!CH_2)$ is most preferable from an industrial point of view.

When used as a positive alkaline solubility increases by an action of an acid polymer (A-3), a polymer comprising a constituent unit (a0-4) wherein hydrogen atoms of the alcoholic hydroxyl group are substituted with an acid dissociable dissolution inhibiting group is preferable. The acid dissociable dissolution inhibiting group is preferably a linear, branched or cyclic alkyloxymethyl group having 1 to 15 carbon atoms, in view of dissociation properties of an acid, and preferably a lower alkoxymethyl group such as methoxymethyl group because of excellent resolution and pattern shape. The content of the acid dissociable dissolution inhibiting group is within a range from 10 to 40%, and preferably from 15 to 30%, based on the entire hydroxyl group because of excellent pattern forming ability.

The general formula (16), which represents a polymer (A-3), is shown below.

(16)

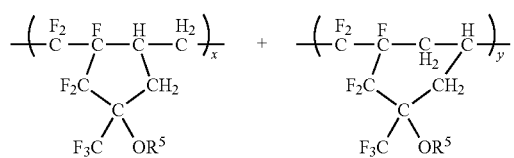

In the general formula (16), $R^5$ is selected from a hydrogen atom or a C1-C15 alkyloxymethyl group; and x and y each represents the content of 10 to 90 mol %.

Such a polymer (A) can be synthesized by a known method. A polystyrene equivalent mass average molecular weight of a resin of the component (A), determined by GPC, is not specifically limited, and is preferably from 5,000 to 80,000, and more preferably from 8,000 to 50,000.

The polymer (A) can be composed of one or more kinds of resins and, for example, two or more kinds of some resins selected from the above polymers (A-1), (A-2) and (A-3) may be used in combination, and also conventionally known other resins for photoresist composition can be used in combination.

The acrylic resin described above has, for example, a structural unit (a1) derived from a (meth)acrylic ester having a acid dissociable, dissolution inhibiting group, and is preferably, for example, a resin containing a structural unit (a1) derived from the (meth)acrylic acid ester having the acid dissociable, dissolution inhibiting group, and also containing a structural unit derived from an additional (meth)acrylic acid ester other than the unit (a1), in which the structural unit derived from the (meth)acrylic acid ester is 80% by mole or more, preferably 90% by mole (most preferably 100% by mole).

In addition, the above resin component comprises additional monomer units having different functions in addition to the above unit (a1) to satisfy resolution properties, anti-dry-etching properties, and the shape of fine patterns. For examples, these structural units may be of the following combination.

Examples include a structural unit derived from a (meth) acrylic ester having a lactone unit (hereinafter, referred to as (a2) or unit (a2)); a structural unit derived from a (meth) acrylic ester having a polycyclic group that contains an alcoholic hydroxyl group or a cyano group (hereinafter, referred to as (a3) or unit (a3)); and a structural unit containing a polycyclic group, which is different from any of the acid dissociable, dissolution inhibiting group of the unit (a1), the lactone unit of the unit (a2), and polycyclic group which contains the alcoholic hydroxyl group or cyano group-containing (hereinafter, referred to as (a4) or (a4)).

The (a2), (a3), and/or (a4) may be suitably combined with each other depending on the desired characteristics or the like. Preferably, the resin may contain (a1) together with at least one unit selected from the group consisting of (a2), (a3), and (a4) to improve both the resolution properties and the shape of resist patterns. In addition, two or more different units of each unit of (a1) to (a4) may be used in combination.

Furthermore, a structural unit derived from the (meth) acrylic acid ester and a structural unit derived from acrylic acid ester are preferably used such that 10 to 85% by mole, preferably 20 to 80% by mole of the structural unit derived from the (meth)acrylic acid ester is mixed with 15 to 90% by mole, preferably 20 to 80% by mole of the structural unit derived from acrylic acid ester with respect to the total moles of the structural unit derived from the (meth)acrylic acid ester and the structural unit derived from acrylic acid ester.

Next, the above (a1) to (a4) units will be described in detail. The (a1) unit is a structural unit derived from (meth)acrylic ester having a acid dissociable, dissolution inhibiting group. The acid dissociable, dissolution inhibiting group of the (a1)

unit, which can be used, is not particularly limited as far as it has alkaline-dissolution preventing properties, which makes the whole resin component insoluble in alkaline before exposure to light, and dissociates from each other by action of an acid generated after exposure to light to make the whole resin component soluble in alkaline. In general, those widely known in the art include: a group that forms a cyclic or chain tertiary alkyl ester; a carboxyl group of (meth)acrylic acid with a tertiary alkoxy carbonyl group; or a chain alkoxy alkyl group.

The acid dissociable, dissolution inhibiting group of the above (a1) may preferably be an acid dissociable, dissolution inhibiting group, which contains an aliphatic polycyclic group. Examples of the polycyclic group include groups each obtained by removing one hydrogen atom from bicycloalkane, tricycloalkane, or tetracycloalkane, which may be substituted with a fluorine atom or a fluorinated alkyl group or may not be substituted therewith. Specifically, the exemplary groups include those obtained by removing one hydrogen atom from polycycloalkane such as adamantane, norbornane, isobornane, tricyclodecane, or tetracyclododecane. Such a polycyclic group may be appropriately selected from many proposed groups which can be used in ArF resist. Among them, an adamanthyl group, a norbornyl group, and a tetracyclododecanyl group are commercially preferable.

Monomer units suitable for the above (a1) will be represented by the general formulae (17) to (23) below. In general formulae (17) to (23), R is a hydrogen atom or a methyl group, $R_1$ is a lower alkyl group, each of $R_2$ and $R_3$ independently represents a lower alkyl group, $R_4$ is a tertiary alkyl group, $R_5$ is a methyl group, and $R_6$ is a lower alkyl group.

Each of the above $R_1$ to $R_3$ and $R_6$ to $R_7$ is preferably a lower linear or branched chain alkyl group having 1 to 5 carbon atoms, such as a methyl group, an ethyl group, a propyl group, an isopropyl group, a n-butyl group, an isobutyl group, a tert-butyl group, a pentyl group, an isopentyl group, and a neopentyl group. Among them, a methyl group and an ethyl group are commercially preferable.

Furthermore, $R_4$ is a tertiary alkyl group such as a tert-butyl group and a tert-amyl group. The tert-butyl group is commercially preferable.

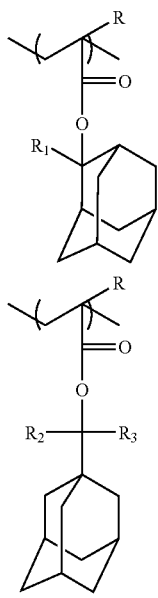

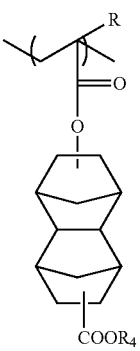

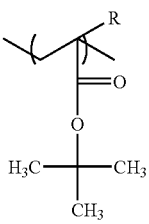

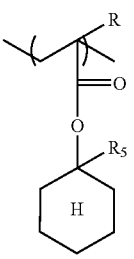

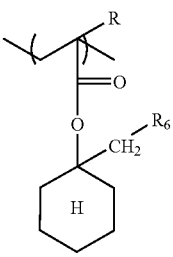

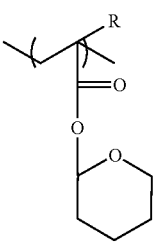

Among those listed above as the (a1) unit, in particular, the structural units represented by the general formulae (17), (18), and (19) are preferable because they are capable of forming patterns having high transparency, high resolution properties, and excellent anti-dry-etching properties.

The above (a2) unit has a lactone unit, so that it can be effective for increasing the hydrophilicity of a developing solution.

Such an (a2) unit may be one having a lactone unit, and may be capable of copolymerizing with any of their structural unit of the resin component.

For instance, examples of the monocyclic lactone unit include a group obtained by removing one hydrogen atom from γ-butyrolactone unit. In addition, examples of the polycyclic lactone unit include a group obtained by removing one hydrogen atom from lactone-containing polycycloalkane.

Favorable monomer units as the above (a2) will be represented by the general formulae (24) to (26) below. In these general formulae, R is a hydrogen atom or a methyl group.

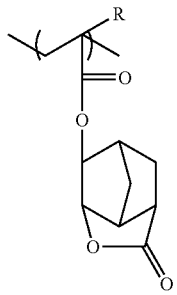

(24)

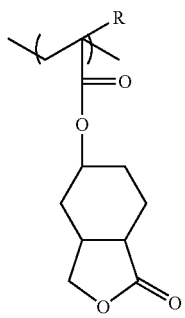

(25)

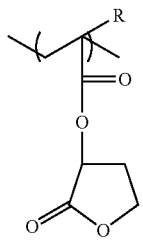

(26)

A γ-butyrolactone ester of (meth)acrylic acid having an ester linkage on the α-carbon as shown in the above general formula (13) and norbornane lactone esters as shown in the general formulae (24) and (25) are particularly commercially available and preferable.

The abovementioned (a3) unit is a structural unit which can be derived from (meth)acrylic ester having a polycyclic group that contains an alcoholic hydroxyl group or a cyano group.

The hydroxyl group in the alcoholic hydroxyl group-containing the polycyclic group or the cyano group is a polar group, so that the use thereof can enhance the hydrophilic properties of the whole resin component to a developing solution, thereby improving alkaline solubility in an exposure portion. Therefore, it is preferable because the resolution properties can be improved when the resin component contains (a3).

Furthermore, the polycyclic group in (a3) may be suitably selected from the same aliphatic polycyclic groups as those exemplified in the description of the above (a1).

Examples of the polycyclic group that contains an alcoholic hydroxyl group or a cyano group in the above (a3), which can be preferably used, include a hydroxyl group-containing adamantyl group and a cyano group-containing adamantyl group but are not particularly limited thereto.

Furthermore, it is preferable that the hydroxyl group-containing adamantyl group is one represented by the general formula (27) below, because of the effect it has on increasing the verticality of a cross sectional shape of the pattern. In this general formula, l is an integer of 1 to 3.

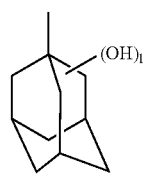

(27)

The abovementioned (a3) unit may be one having a polycyclic group that contains an alcoholic hydroxyl group as described above and is capable of copolymerizing with any of other structural units of the resin component.

Concrete examples of the (a3) unit preferably include structural units represented by the general formula (28) described below. Here, in the general formula (28), R is a hydrogen atom or a methyl group.

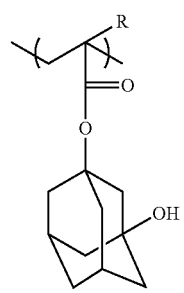

(28)

In the above (a4) unit, the polycyclic group being "different from any of the abovementioned acid dissociable, dissolution inhibiting group, the abovementioned lactone unit, and the abovementioned polycyclic group that contains an alcoholic hydroxyl group or a cyano group" means that the polycyclic group of the (a4) unit does not correspond to any of the acid dissociable, dissolution inhibiting group of the (a1) unit, the lactone unit of the (a2) unit, and the polycyclic group that contains an alcoholic hydroxyl group or a cyano group of the (a3) unit. Alternatively, it means that the (a4) unit does not retain any of the acid dissociable, dissolution inhibiting group of the (a1) unit, the lactone unit of the (a2) unit, and the polycyclic group that contains an alcoholic hydroxyl group or a cyano group of the (a3) unit, which constitute the resin component.

The polycyclic group of the above (a4) unit may be selected such that it does not correspond to a structural unit used as any of the above (a1) to (a3) units in one resin component, so that it is not particularly limited. For instance, the polycyclic group of the (a4) unit may be the same aliphatic polycyclic group as one exemplified as the abovementioned (a1) unit. In addition, many conventionally known ArF positive type resist materials can be used.

Particularly, it is preferable that the material is at least one or more selected from a tricyclodecanyl group, an adamantyl group, and a tetracyclododecanyl group, because they are commercially available.

The (a4) unit may be any of those having any of the polycyclic groups described above and which is capable of copolymerizing with any of the other structural units of the resin component.

Preferable examples of the abovementioned (a4) will be represented by the general formulae (29) to (31) described below. In these general formulae, R is a hydrogen atom or a methyl group.

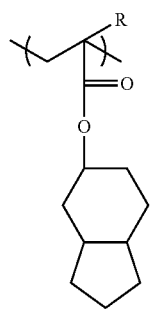
(29)

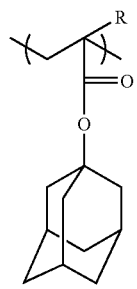
(30)

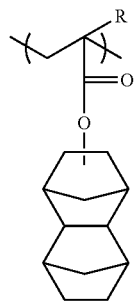
(31)

Because of excellent resolution properties, it is preferable that the composition of the above acrylic resin component contains 20 to 60% by mole, preferably 30 to 50% by mole of the (a1) unit with respect to the total of the structural units that constitute the resin component. In addition, because of excellent resolution, it is preferable that 20 to 60% by mole, preferably 30 to 50% by mole of the (a2) unit is contained with respect to the total structural units that constitute the resin component.

Furthermore, when the (a3) unit is used, because of excellent shape of resist patterns, it is preferable that the 5 to 50% mole, preferably 10 to 40% by mole of the (a3) is contained with respect to the total structural units that constitute the resin component.

When the (a4) unit is used, because of excellent resolution properties from isolated patterns to semi-densified patterns, it is preferable that the 1 to 30% mole, preferably 5 to 20% by mole of the (a4) is contained with respect to the total structural units that constitute the resin component.

The (a1) unit may be suitably combined with at least one unit selected from the (a2), (a3), and (a4) units for any purpose. A three-component polymer of the (a1) unit with the (a2) and (a3) units is preferable because of being excellent in shape of resist patterns, degree of excess-exposure, heat resistance, and resolution. In this case, the contents of the respective structural units (a1) to (a3) are as follows: preferably, the content of the (a1) unit is 20 to 60% by mole, the content of the (a2) unit is 20 to 60% by mole, and the content of the (a3) unit is 5 to 50% by mole.

Furthermore, the mass average molecular weight of the resin component (hereinafter, referred to as polystyrene conversion) is, but not particularly limited to, the range of 5,000 to 30,000, more preferably in the range of 8,000 to 20,000. If it exceeds this range, the solubility of the resin component to a resist solvent becomes worse. If it is smaller than the range, the anti-dry-etching properties or the shape of resist pattern cross section may become worse.

Furthermore, the abovementioned cycloolefin resin is preferably a resin obtained by copolymerizing a structural unit (a5) represented by the general formula (32) described below with a structural unit optionally obtained from the above (a1).

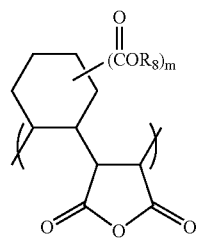
(32)

(in which $R_8$ is a substituent exemplified as a acid dissociable, dissolution inhibiting group in the above (a1) unit, and m is an integer of 0 to 3)

Here, if m is zero (0) in the above (a5) unit, it is preferable to use a copolymer having the (a1) unit.

Furthermore, examples of the above silsesquioxane resin include a structural unit (a6) represented by the following general formula (33) and a structural unit (a7) represented by the following general formula (34).

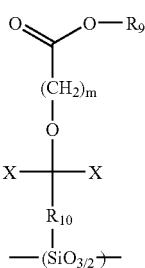
(33)

(in which $R_9$ is a acid dissociable, dissolution inhibiting group comprised of a hydrocarbon group having an aliphatic monocyclic or polycyclic group, $R_{10}$ is a linear, branched, or cyclic saturated aliphatic hydrocarbon group, X is an alkyl group having 1 to 8 carbon atoms in which at least one hydrogen atom is substituted with a fluorine atom, and m is an integer of 1 to 3).

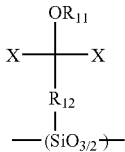

(34)

(in which $R_{11}$ is a hydrogen atom, or a linear, branched, or cyclic alkyl group, $R_{12}$ is a linear, branched, or cyclic saturated aliphatic hydrocarbon group, and X is an alkyl group having 1 to 8 carbon atoms in which at least one hydrogen atom is substituted with a fluorine atom).

In the abovementioned (a6) and (a7), the acid dissociable, dissolution inhibiting group of $R_9$ is a group having alkaline-dissolution preventing properties that make the whole silsesquioxane resin alkaline-insoluble, while it is dissociated by the action of an acid generated from an acid-generating agent after exposure to light, thereby making the whole silsesquioxane resin alkaline-soluble.

Such a group may be any of those represented by the chemical formulae (35) to (39) described below, such as a bulky acid dissociable, dissolution inhibiting group comprised of a hydrocarbon group having an aliphatic monocyclic or polycyclic group. The use of such a acid dissociable, dissolution inhibiting group prevents degasification as the dissolution-preventing group is hardly gasified after dissociation.

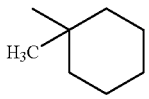

(35)

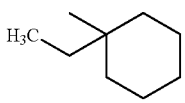

(36)

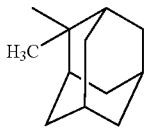

(37)

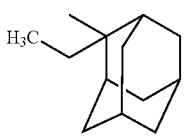

(38)

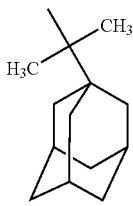

(39)

The number of carbon atoms in the above $R_9$ is preferably 7 to 15, more preferably 9 to 13, because of the difficulty of gasification when dissociated, as well as appropriate dissolubility to a resist solvent and appropriate dissolubility to a developing solution.

The acid dissociable, dissolution inhibiting group, which can be used, may be suitably selected from many proposed resins for resist compositions depending on an optical source used, such as an ArF Excimer laser, as long as the acid dissociable, dissolution inhibiting group is comprised of a hydrocarbon group having an aliphatic monocyclic or polycyclic group. In general, one that forms a cyclic tertiary alkyl ester with the carboxyl group of an (meth)acrylic acid and is widely known in the art.

In particular, it is preferable that an acid dissociable, dissolution inhibiting group contains an aliphatic polycyclic group. The aliphatic polycyclic group may be suitably selected from many of those proposed in the ArF resist. Examples of the aliphatic polycyclic group include those obtained by removing one hydrogen atom from bicycloalkane, tricycloalkane, tetracycloalkane, or the like. More specifically, examples of the aliphatic polycyclic group include those obtained by removing one hydrogen atom from adamantane, norbornane, isobornane, tricyclodecane, tetracyclododecane, or the like.

Among the abovementioned general formulae, a silsesquioxane resin having a 2-methyl adamantyl group represented by the chemical formula (37) and/or a 2-ethyl adamantyl group represented by the chemical formula (38) is preferable because of the difficulty in degasification, while having excellent resist characteristics such as resolution properties and heat resistance.

Furthermore, the number of carbon atoms in each of the above $R_{10}$ and $R_{12}$ is preferably in the range of 1 to 20, more preferably in the range of 5 to 12 in terms of dissolubility to a resist solvent and molecular-size control. Particularly, a cyclic, saturated aliphatic hydrocarbon group is preferable because of its advantageous properties, such as the transparency of the resulting silsesquioxane resin to high-energy light, a high glass transition point (Tg), and easiness in control of acid generation from an acid-generating agent at PEB (heating after exposure to light).

The cyclic, saturated aliphatic hydrocarbon group may be a monocyclic group or a polycyclic group. Examples of the polycyclic group include those obtained by removing two hydrogen atoms from bicycloalkane, tricycloalkane, tetracycloalkane, or the like. More specifically, examples of the polycyclic group include those obtained by removing two hydrogen atoms from polycycloalkanes such as adamantane, norbornane, isobornane, tricyclodecane, and tetracyclododecane.

More specifically, examples of the $R_{10}$ and $R_{12}$ are groups obtained by removing two hydrogen atoms from aliphatic compounds represented by the chemical formulae (40) to (45) described below or derivatives thereof.

(40)

(41)

-continued

(42)

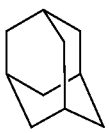
(43)

(44)

(45)

In the aliphatic compounds of the above chemical formulae (40) to (45), the derivatives mean those obtained by substituting at least one hydrogen atom with any of groups including lower alkyl groups such as a methyl group and an ethyl group and halogen atoms such as an oxygen atom, a fluorine atom, a chlorine atom, a bromine atom. Among them, a group obtained by removing two hydrogen atoms from an aliphatic compound selected from the group consisting of the chemical formulae (40) to (45) is preferable in that it has high transparency and is commercially available.

Furthermore, the above $R_{11}$ is a lower alkyl group having preferably 1 to 10 carbon atoms, more preferably 1 to 4 carbon atoms in terms of dissolubility to a resist solvent. More specifically, examples of the above $R_{11}$ include a methyl group, an ethyl group, a propyl group, an isopropyl group, a n-butyl group, a sec-butyl group, a tert-butyl group, a cyclopentyl group, a cyclohexyl group, a 2-ethylhexyl group, and a n-octyl group.

$R_{11}$ is suitably selected from the above candidates depending on the desired alkaline dissolubility of the silsesquioxane resin. The alkaline dissolubility becomes highest when the $R_{11}$ is a hydrogen atom. In other words, there is an advantage in that an increase in alkaline dissolubility leads to an increase in sensitivity.

On the other hand, the greater the number of carbon atoms in the above alkyl group, and the bulkier the above alkyl group becomes, the more the alkaline dissolubility of the silsesquioxane resin decreases. A decrease in alkaline dissolubility leads to an increase in resistance to an alkaline developing solution, so that an exposure margin at the time of forming resist patterns using the silsesquioxane resin can be improved while lowering size variations due to exposure. In addition, uneven development disappears, so that the roughness of the edged portions of formed resist patterns can be improved.

In the above general formulae (33) and (34), in particular, x is preferably a linear alkyl group. The alkyl group is a lower alkyl group having 1 to 8 carbon atoms, preferably 1 to 4 carbon atoms, in terms of glass transition (Tg) point of the silsesquioxane resin or dissolubility to a resist solvent. Preferably, the more the number of hydrogen atoms to be substituted with fluorine atoms increases, the more the transparency to high energy light or an electron beam of 200 nm or less improves. A perfluoroalkyl group in which all of the hydrogen atoms are substituted with fluorine groups is most preferable. X may be identical with each other or may be different from each other. Here, m in the general formula (33) is an integer of 1 to 3, preferably 1 because of tendency to dissociate a acid dissociable, dissolution inhibiting group.

More specifically, examples of the silsesquioxane resin include those represented by the general formulae (46) and (47) as described below.

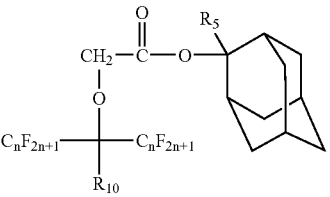
(46)

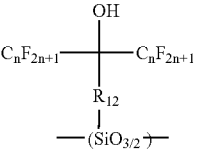
(47)

(in which $R_6$, $R_{10}$, $R_{12}$, and n are the same as those described above).

In all of the structural units that constitute the silsesquioxane resin of the present invention, the percentage of the structural unit represented by each of (a6) and (a7) is in the range of 30 to 100% by mole, preferably 70 to 100% by mole, more preferably 100% by mole.

In addition, the percentage of the structural unit represented by (a6) is preferably in the range of 5 to 70% by mole, more preferably 10 to 40% by mole with respect to the total of the structural units represented by (a6) and (a7). The percentage of the structural unit represented by (a7) is preferably in the range of 30 to 95% by mole, more preferably 60 to 90% by mole.

By defining the percentage of the structural unit represented by (a6) within the above range, the percentage of the acid dissociable, dissolution inhibiting group can be directly defined. A change in alkaline dissolubility before and after exposing the silsesquioxane resin to light is suitable for a base resin of a positive type resist composition.

The silsesquioxane resin may have an additional structural unit other than those represented by (a6) and (a7) as long as it does not impair the effects of the present invention. For instance, it may be one used in a silsesquioxane resin for a resist composition of ArF Excimer laser, such as an alkyl silsesquioxane unit (e.g. the general formulae (48)) having any of alkyl groups (R') including a methyl group, an ethyl group, a propyl group, and a butyl group.

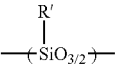
(48)

The mass average molecular weight (Mw) of the silsesquiloxane resin (polystyrene conversion with gel permeation chromatography) is, but not particularly limited to, preferably in the range of 2,000 to 15,000, more preferably 3,000 to 8,000. If it exceeds this range, the solubility of the resin component to a resist solvent becomes worse. If it is smaller than that range, the shape of resist pattern cross section tends to become worse.

Furthermore, the ratio of mass average molecular weight (Mw) to number average molecular weight (Mn) is, but not particularly limited to, preferably in the range of 1.0 to 6.0, more preferably 1.5 to 2.5. If it exceeds this range, the resolution and the shape of patterns tend to become worse.

In addition, the silsesquioxane resin of the present invention is a polymer having a basic backbone, silsesquioxane, which is constructed of structural units represented by (a6) and (a7). Thus, it has a high transparency to high energy light or an electron beam at 200 nm or less. Therefore, the positive type resist composition containing the silsesquioxane resin of the present invention is useful in, for example, lithography using a light source at a wavelength shorter than that of an ArF Excimer laser and is capable of forming fine resist patterns of 150 nm or less, or 120 nm or less in line width even in a monolayer process. In addition, using as an upper layer of a two-layered resist laminate, it is also useful in process of forming fine resist patterns of 120 nm or less, or 100 nm or less.

Furthermore, concrete examples of the resin component to be used in the above negative type resist composition preferably include those described below but are not particularly limited as long as it has been conventionally used.

Such a resin component is preferably a resin (a8) having alkaline-insoluble properties with acid and contains two functional groups, which can form esters in molecule by reacting with each other. The resin is imparted with alkaline insolubility such that the functional groups form ester by dehydration with the action of acid generated by an acid-generating agent concurrently added to resist materials. The term "two functional groups which can form ester by reacting with each other" means, for example, a hydroxyl group and a carboxylic or carbonic aid ester for forming a carboxylic acid ester. Such a resin may preferably contain a hydroxyalkyl group and at least one of a carboxyl group and a carboxylic acid ester on a side chain of the resin main backbone.

Furthermore, the resin component may be also preferably a resin component (a9) comprised of a polymer having dicarboxylic acid monoester unit.

In other words, the above (a8) is a resin component having at least a structural unit represented by the general formula (49) described below.

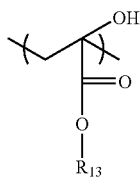

(49)

(in which $R_{13}$ is hydrogen atom, an alkyl group having 1 to 6 carbon atoms, or an alkyl group having a polycyclic ring backbone, such as a norbornyl group, an adamantyl group, a tetracyclododecyl group, or a tricyclodesyl group).

Examples of such a resin include a polymer (homopolymer or copolymer) (aB-1) of at least one selected from α-(hydroxyalkyl)acrylic acid and α-(hydroxyalkyl)acrylic acid alkyl ester; and a copolymer (a8-2) of at least one monomer selected from α-(hydroxyalkyl)acrylic acid and α-(hydroxyalkyl)acrylic acid alkyl ester and at least one monomer selected from any other ethylenic unsaturated carboxylic acid and ethylenic unsaturated carboxylic acid ester.

The above polymer (a8-1) may be preferably a copolymer of α-(hydroxyalkyl)acrylic acid and α-(hydroxyalkyl)acrylic acid alkyl ester. In addition, the copolymer (a8-2) may be preferably prepared using at least one selected from the group consisting of: acrylic acid, methacrylic acid, acryl acid alkyl ester, and methacrylic acid alkyl ester as the ethylenic unsaturated carboxylic acid or ethylenic unsaturated carboxylic acid ester.

Examples of hydroxyalkyl groups in α-(hydroxyalkyl) acrylic acid and α-(hydroxyalkyl)acrylic acid alkyl ester as described above include lower hydroxyalkyl groups such as a hydroxymethyl group, a hydroxyethyl group, a hydroxypropyl group, and a hydroxybutyl group. Among them, the hydroxyethyl group and the hydroxymethyl group are preferred from the ease of forming ester.

In addition, examples of an alkyl group on the alkyl ester portion of the α-(hydroxyalkyl)acrylic acid alkyl ester include: lower alkyl groups such as a methyl group, an ethyl group, a propyl group, an isopropyl group, a n-butyl group, a sec-butyl group, a tert-butyl group, and an amyl group; and bridging-type polycyclic hydrocarbon groups such as a bicyclo[2,2,1]heptyl group, a norbornyl group, an adamantyl group, a tetracyclo[4,4,0,1$^{2.5}$,1$^{7.10}$]dodecyl group, and tricyclo[5,2,1,0$^{2.6}$]decyl group. When the alkyl group on the ester portion is a polycyclic hydrocarbon group, it is effective to enhance the anti-dry-etching properties. Among these alkyl groups, particularly, a lower alkyl group such as a methyl group, an ethyl group, a propyl group, and a butyl group are preferable because they are cheap and easily obtainable and thus used as an alcohol component for the formation of ester.

In case of a lower alkyl ester, esterification with a hydroxyalkyl group may occur in a manner similar to the carboxyl group. However, esterification hardly occurs in case of a bridging-type polycyclic hydrocarbon. Therefore, for introducing the ester with the bridging-type polycyclic hydrocarbon into the resin, it is preferable that the resin has a carboxyl group on the side chain thereof.

On the other hand, examples of other ethylenic unsaturated carboxylic acid or ethylenic unsaturated carboxylic acid ester in the above (aB-2) include: unsaturated carboxylic acids such as an acrylic acid, a methacrylic acid, a maleic acid, and a fumaric acid; and alkyl esters, such as methyl, ethyl, propyl, isopropyl, n-butyl, isobutyl, n-hexyl, and octylester, of these unsaturated carboxylic acids. Examples of the alkyl group of the ester portion include acrylic acid esters or methacrylic acid esters having bridging-type polycyclic hydrocarbon groups such as a bicyclo[2,2,1]heptyl group, a bornyl group, an adamantyl group, a tetracyclo[4,4,0,1$^{2.5}$,1$^{7.10}$]dodecyl group, and tricyclo[5,2,1,0$^{2.6}$]decyl group. Among them, acrylic acid and methacrylic acid or lower alkyl esters such as methyl, ethyl, propyl, and n-butyl ester thereof are preferable because of being cheap and easily obtainable.

In the resin of the resin component (a8-2), the ratio of at least one monomer unit selected from α-(hydroxyalkyl) acrylic acid and α-(hydroxyalkyl)acrylic acid alkyl ester to at least one monomer unit selected from any of other ethylenic unsaturated carboxylic acids and ethylenic unsaturated carboxylic acid esters is a mole ratio in the range of 20:80 to 95:5, particularly in the range of 50:50 to 90:10. If the ratio of both units is in the above range, it will be easy to form ester between or within molecules and good resist patterns can be thus obtained.

In addition, the resin component (a9) is a resin component having at least a structural unit represented by the general formula (50) or (51) described below.

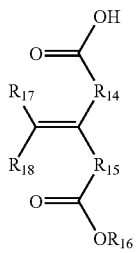

(50)

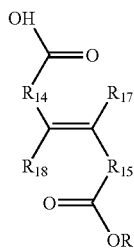

(51)

(in which $R_{14}$ and $R_{15}$ represent an alkyl group having 0 to 8 carbon atoms, $R_{16}$ represents a substituent group having at least 2 or more aliphatic structure, and $R_{17}$ and $R_{18}$ represent an hydrogen atom or an alkyl group having 1 to 8 carbon atoms).

A negative type resist composition using such a resin composition having a dicarboxylic acid monoester monomer unit is preferable in that it has high resolution properties and reduced line-edge roughness. In addition, it shows a high resistance to swelling, so that it is preferable in a liquid immersion lithography process.

Examples of such a dicarboxylic acid monoester compound include fumaric acid, itaconic acid, mesaconic acid, glutaconic acid, and trumatic acid.

Furthermore, examples of the resin having the abovementioned dicarboxylic acid monoester unit preferably include: a polymer or a copolymer (a9-1) of dicarboxylic acid monoester monomers; and a copolymer (a9-2) of the carboxylic acid monoester monomer with at least one monomer selected from the group consisting of: α-(hydroxyalkyl) acrylic acid, α-(hydroxyalkyl)acrylic acid alkyl ester, and any other ethylenic unsaturated carboxylic acids and ethylenic unsaturated carboxylic acid esters as described above.

The resin component to be used for the abovementioned negative type resist may be used independently or may be used in combinations of two or more. In addition, the resin composition has a mass average molecular weight of 1,000 to 50,000, preferably 2,000 to 30,000.

A positive resist using a fluorine-based resin and acrylic resins ((a1) to (a4)) among the abovementioned resins is a resist containing a resin which is comparatively excellent in liquid immersion resistance, and the resolution of a pattern is likely to deteriorate as the size approaches the size of limiting resolution in liquid immersion lithography. Several factors are contributing to the deterioration of resolution, and in order to eliminate these, it is very effective to separate an immersion liquid from resist film by forming a protective film of the present invention.

A positive resist using silsesquioxane-based resins (a6) and (a7) or a negative resist using specific resins (a8) and/or (a9) is considered to have a lower liquid immersion resistance than that of a positive resist using the abovementioned acrylic resin, therefore making possible to improve suitability for liquid immersion lithography by using a protective film of the present invention.

Furthermore, when a cycloolefin-based resin is used, it is known to be inferior in liquid immersion lithography resistance, as described in the Comparative Examples of the present invention, making it impossible to form a pattern. Even a positive resist containing a resin such as this can be applied to liquid immersion lithography by using the protective film of the present invention.

Furthermore, an acid-generating agent to be used in combination with a resin component for the above positive or negative type resist may be any agent suitably selected from those conventionally known as acid-generating agents for chemically-amplified resist.

Concrete examples of the acid-generating agent include: onium salts such as diphenyliodonium trifluoromethane sulfonate, (4-methoxyphenyl)phenyliodonium trifluoromethane sulfonate, bis(p-tert-butylphenyl) iodonium trifluoromethane sulfonate, triphenylsulfonium trifluoromethane sulfonate, (4-methoxyphenyl)diphenylsulfonium trifluoromethane sulfonate, (4-methylphenyl)diphenylsulfonium nonafluorobutane sulfonate, (p-tert-butylphenyl)diphenylsulfonium trifluoromethane sulfonate, diphenyliodonium nonafluorobutane sulfonate, bis(p-tert-butylphenyl)iodonium nonafluorobutane sulfonate, triphenylsulfonium nonafluorobutane sulfonate, (4-trifluoromethylphenyl)diphenylsulfonium trifluoromethane sulfonate, (4-trifluoromethylphenyl)diphenylsulfonium nonafluorobutane sulfonate, and tri(p-tert-butylphenyl)sulfonium trifluoromethane sulfonate.

Among onium salts, triphenylsulfonium salts are preferably used because of difficulty in decomposition and generation of organic gas. The amount of the triphenylsulfonium salt added is preferably in the range of 50 to 100% by mole, more preferably 70 to 100% by mole, most preferably 100% by mole with respect to the total amount of the acid-generating agent.

In addition, among triphenylsulfonium salts, triphenylsulfonium salt having perfluoroalkyl sulfonate ions as anions, which is represented by the general formula (52) described below, is preferably used because of its high sensitivity.

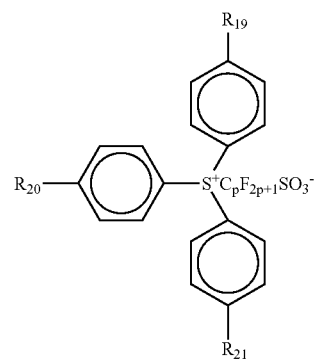

(52)

(in which $R_{19}$, $R_{20}$, and $R_{21}$ independently represent an hydrogen atom, a lower alkyl group having 1 to 8, preferably 1 to 4 carbon atoms, or a halogen atom such as chlorine, fluorine, or bromine; p is an integer of 1 to 12, preferably 1 to 8, more preferably 1 to 4).

The acid-generating agents described above may be used independently or may be used in combinations of two or more. The amount of the acid-generating agent added may be 0.5 to 30 parts by mass, preferably 1 to 10 parts with respect to 100 parts by mass of the above resin component. If it is less than 0.5 parts by mass, the formation of patterns is insufficient. On the other hand, if it exceeds 30 parts by mass, a uniform solution is difficult to obtain and thus it may cause a decrease in preservation stability.

Furthermore, the positive or negative type resist composition of the present invention is produced by dissolving any of components described later together with the above resin component and an acid-generating agent in preferably an organic solvent.

The organic solvent may be any of those that dissolve both the resin component and the acid-generating agent and make a solution uniform. Thus, one or more of any conventional solvents for chemically-amplified resist may be suitably selected and used.

The organic solvents may include: ketones such as acetone, methyl ethyl ketone, cyclohexanone, methyl isoamyl ketone, 2-heptanone; polyvalent alcohols and derivatives thereof, such as ethylene glycol, ethylene glycol monoacetate, diethylene glycol, diethylene glycol monoacetate, propylene glycol, propylene glycol monoacetate, dipropylene glycol or monomethyl ether of dipropylene glycol monoacetate, monoethyl ether, monopropyl ether, monobutyl ether, and monophenyl ether; cyclic ethers such as dioxane; and esters such as methyl lactate, ethyl lactate, methyl acetate, ethyl acetate, butyl acetate, methyl pyruvate, ethyl pyruvate, methoxy methyl propionate, and ethoxy ethyl propanoate. These organic solvents may be used independently or as a mixture solvent of two or more solvents.

The positive or negative type resist may contain any amines conventionally known in the art, preferably secondary lower aliphatic amines, tertiary lower aliphatic amines, and organic acids such as organic carboxylic acids, and phosphorous oxo acid, for improving the shape of resist patterns and temporal stabilities, or as a quencher.

The lower aliphatic amines refer to alkyl or alkyl alcohol amines having 5 or less carbon atoms. Examples of the secondary and tertiary amines include trimethylamine, diethylamine, triethylamine, di-n-propylamine, tri-n-propylamine, tribenthylamine, diethanolamine, and triethanolamine. Among these, in particular, an alkanolamine such as triethanol amine is preferable. They may be used independently or in combinations of two or more.

These amines may be typically used in the range of 0.01 to 5.0% by mass with respect to the above resin component. Preferred examples of the organic carboxylic acid include, for example, malonic acid, citric acid, malic acid, succinic acid, benzoic acid, and salicylic acid.

Examples of phosphorous oxo acid or a derivative thereof include: phosphoric acids and ester derivatives thereof, such as phosphoric acid, phosphoric acid di-n-butylester, and phosphoric acid diphenylester; phosphonic acids and ester derivatives thereof, such as phosphonic acid, phosphonic acid dimethylester, phosphonic acid-di-n-butylester, phenyl phosphonate, phosphonic acid diphenylester, and phosphonic acid dibenzylester; phosphinic acids and ester derivatives thereof, such as phosphinic acid and phenyl phosphinate. Among these, in particular, phosphonic acid is particularly preferable.

The organic acid used is in the range of 0.01 to 5.0 parts by mass per 100 parts by mass of the resin composition. Each of them may be used independently or in combinations of two or more.

These organic acids may be used at an amount in the range of an equivalent mole or less to the amount of the amine.

The positive type resist composition of the present invention may further contain additional additives with miscibility if desired. The additives include, for example, an additional resin for improving the characteristics of a resist film; a surfactant for improving coating abilities, a dissolution-preventing agent, a plasticizer, a stabilizer, a colorant, and a halation inhibitor.

Furthermore, the negative type resist composition of the present invention may be added with a cross-linking agent if required for the purpose of improving the density of cross-linking, and also improving the shape and resolution properties of a resist pattern, and anti-dry-etching properties of resist patterns.

A given cross-linking agent may be suitably selected from those conventionally known in the art, which have been used in negative type resists of conventional chemical amplification.

Examples of the cross-linking agent include: aliphatic cyclic hydrocarbons or oxygen-containing derivatives thereof having a hydroxyl group or a hydroxyalkyl group or both of them, such as 2,3-dihydroxy-5-hydroxymethyl norbornane, 2-hydroxy-5,6-bis(hydroxymethyl)norbornane, cyclohexane dimethanol, 3,4,8 (or, 9)-trihydroxy tricyclodecane, 2-methyl-2-adamantanol, 1,4-dioxane-2,3-diol, and 1,3,5-trihydroxycyclohexane; and compounds prepared by reacting any of amino-containing organic compounds such as melamine, acetoguanamine, benzoguanamine, urea, ethylene urea, and glycol uryl with formaldehyde or with both formaldehyde and lower alcohol, and then substituting a hydrogen atom of the amino group with a hydroxymethyl group or a lower alkoxymethyl group, specifically the compounds including hexamethoxymethyl melamine, bis-methoxy-methylurea, bis-methoxymethyl bis-methoxy-ethylene urea, tetramethoxy methyl glycol uryl, and tetra butoxymethyl glycol uryl, but are not particularly limited. In particular, tetrabutoxymethyl glycol uryl is preferable.

These cross-linking agents may be used independently or may be used in combinations of two or more.

A resist pattern forming method for liquid immersion lithography using the protective film of the present invention will now be described.

First, a common resist composition is coated onto a substrate such as silicone wafer using a spinner and then prebaked (PAB treatment).

An organic or inorganic antireflective film can be provided between a substrate and a coating layer of a resist composition to form a two-layered laminate.

The above processes can be conducted by a known method. It is preferable that the operation conditions are appropriately set according to the composition and characteristics of a resist composition used.

Next, the resist protective film is formed by uniformly coating a material for forming a resist protective film of the present invention, such as a composition prepared by dissolving a "polymer having a monomer constituent unit represented by the chemical formula (3)" in 2-methyl-1-propylalcohol on the surface of a resist film (single layer, plural layers), followed by curing.

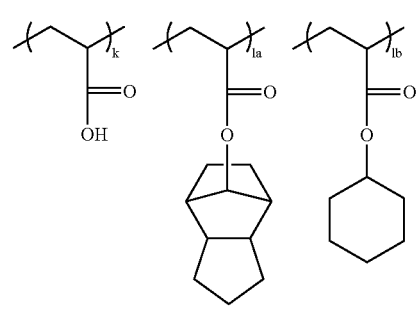

(3)

-continued

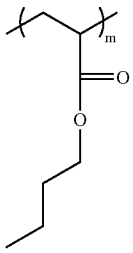

(in which k, la, lb and m represent the content (mol %) of each constituent unit, k:la:lb:m=30:10:20:40, and la+lb represents mol % corresponding to l in the general formulas (1) and (2)).

The substrate, on which a resist film covered with the protective film is formed, is immersed in a refractive index liquid (a liquid having a refractive index which is larger than that of an air and smaller than that of the resist film: pure water, deionized water, fluorine-based solvent or a silica-based solvent in the case specialized in the present invention).

The resist film of the substrate in an immersed state is selectively exposed via a desired mask pattern. Accordingly, exposure light penetrates into the refractive index liquid and protective film, reaching the resist film at this time. At this time, the resist film is completely shut off from the refractive index liquids such as pure water, by the protective film, and thus deterioration such as swelling is not caused by permeation of the refractive index liquid. In addition, the optical characteristics such as the refractive index of the refractive index liquid do not deteriorate as a result of dissociation of a component in the refractive index liquid (pure water, deionized water, or a fluorine-based solvent).

The wavelength of light used in the exposure is not specifically limited, and the exposure can be conducted using radiation such as that of an ArF excimer laser, KrF excimer laser, $F_2$ excimer laser, EUV (extreme ultraviolet ray), VUV (vacuum ultraviolet ray), electron beam, X-ray and soft X-ray. The kind of radiation is mainly decided according to characteristics of a resist film.

As described above, in the resist pattern forming method of the present invention, a liquid having a refractive index larger than that of an air and smaller than that of the resist film employed (refractive index liquid) is disposed onto the resist film via a protective film upon exposure. During this operation, the resist film is permeated by being brought into contact with the refractive index liquid. However, this permeation can be prevented by using the protective film of the present invention. Examples of such a refractive index liquid include water (pure water, deionized water), or a fluorine-based inert liquid. Specific examples of the fluorine-based inert liquid include liquids containing fluorine-based compounds such as $C_3HCl_2F_5$, $C_4F_9OCH_3$, $C_4F_9OC_2H_5$ and $C_5H_3F_7$ as main components. Among these liquids, in view of cost, safety, environmental problems and general-purpose properties, the use of water (pure water or deionized water) is preferred. When using exposure light having a wavelength of 157 nm, a fluorine-based solvent is preferably used in view of less absorption of exposure light.

The refractive index of the refractive index liquid used is not specifically limited as long as it is within range "which is larger than the refractive index of an air and smaller than that of a resist composition used". The present invention is excellent in that liquid immersion medium having a high refractive index, expected to exploit in the future, is applicable.

After the exposure process in liquid immersion is completed, the substrate is removed from the refractive index liquid, and the liquid is removed from the substrate. Next, the resist film is subjected to PEB (post exposure bake) without removing the protective film on the exposed resist film, and then developed using an alkaline developing solution composed of an aqueous alkaline solution. The developing solution used in this development treatment is alkaline, and therefore, the protective film is dissolved and discharged; and then the soluble portion of the resist film is dissolved and discharged. The development treatment may be followed by postbaking. Preferably, rinsing is conducted using pure water. In the water rinsing process, water is dripped or sprayed over the surface of the substrate while rotating, thereby washing away the protective film component and the resist composition dissolved by the developing solution, and the developing solution on the substrate. Then, a resist pattern, in which a resist film is patterned in a shape corresponding to a mask pattern, is obtained by drying. As described above, in the present invention, removal of the protective film and the development of the resist film are simultaneously achieved by a single development process. Because the protective film formed by the material of the present invention has an improved water-shedding property, immersion solvent (refractive index liquid) can be easily separated, the amount of the liquid immersion solvent adhered on the protective film decreases, and medium leakage is prevented.

By forming resist patterns in this way, resist patterns having fine line widths, particularly line-and-space patterns having a small pitch can be produced with good resolution. Here, the term "pitch" in line-and-space patterns refers to a total distance of a resist pattern width and a space width in the line width direction of pattern.

EXAMPLES

Hereinafter, examples of the present invention will be described. However, these examples are only provided for appropriately illustrating the present invention and do not intend to restrict the present invention at all.

Example 1

In this example, a refractive index and an absorption coefficient of a material for forming a resist protective film of the present invention were measured when the angle of incidence of light had wavelengths of 157 nm, 193 nm or 248 nm, respectively. Then, a protective film was formed on a substrate using a material for forming a resist protective film of the present invention and water repellency, water resistance, and solubility in an alkaline developing solution of this protective film was evaluated.

As a base polymer of a protective film forming material, a copolymer having a constituent unit represented by aforementioned general formula (3) (k:la:lb:m=30:10:20:40 (mol %)) was used. As a solvent, 2-methyl-1-propanol (isobutanol) was used, each 2.5 mass % solution being prepared and used as a composition for forming a resist protective film.

A refractive index N of the base polymer of the material was 1.8157, 1.6655 or 1.5661 when the angle of incidence of the light had wavelengths of 157 nm, 193 nm or 248 nm, respectively.

Then, 2 µL of deionized water was dropped on the protective film thus formed by using the material, and a contact angle of water droplets formed on the film was measured. As a result, it was confirmed that the contact angle is 78 degrees on average. As is apparent from a comparison with a conventional protective film having a contact angle of 65 to 70 degrees, the contact angle noticeably increases and is suited for use.

Furthermore, the material was coated onto a semiconductor substrate under coating conditions of 1500 rpm using a spin coater. After coating, a protective film for evaluation was obtained by being cured through a heat treatment at 90° C. for 60 seconds. The protective film had a thickness of 70 nm.

The evaluation of the protective film was carried out with respect to three items, for example, (i) confirmation of the surface state by visual observation, (ii) measurement of thickness loss after rinsing with pure water for 120 seconds in case of simulating immersion in a liquid (pure water) in a liquid immersion lithography process, and (iii) a dissolution rate (in terms of film thickness: nm/second) when immersed in an alkaline developing solution (TMAH having a concentration of 2.38%).

As a result, the visually observed surface state was good. The thickness of the film after water rinsing was 70 nm, and neither swelling nor thickness loss occurred and the good surface state was maintained. Furthermore, the dissolution rate by a developing solution was 60 nm/second or more. It was judged by these values that the protective film has sufficient performances for a resist protective film for liquid immersion lithography.

Example 2

The following resin component, acid generator, and nitrogen-containing organic compound were uniformly dissolved in an organic solvent to prepare a resist composition.

As the resin component, 100 parts by mass of a copolymer including a constituent unit represented by the following chemical formula (53) was used. The contents of the respective constituent units l, m and n used in the preparation of the resin component were respectively 20 mol %, 40 mol % and 40 mol %.

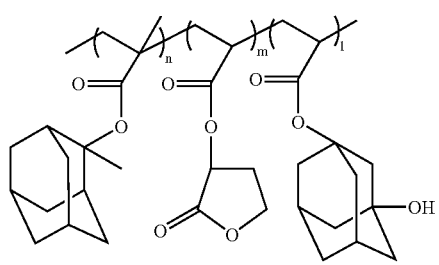

(53)

As the acid generator, 2.0 parts by mass of triphenylsulfonium nonafluorobutanesulfonate and 0.8 parts by mass of tri(tert-butylphenyl)sulfonium trifluoromethanesulfonate were used.

As the organic solvent, an aqueous solution having a concentration of 7.0% of a mixed solvent of propylene glycol monomethyl ether and propylene glycol monomethyl ether acetate (mixing ratio: 6:4) was used. As the nitrogen-containing organic compound, 0.25 parts by mass of triethanolamine was used. As an additive, 25 parts by mass of γ-butyrolactone was added.

Using the resist composition thus prepared, a resist pattern was formed. First, an organic antireflective film composition "ARC29" (trade name, manufactured by Brewer Co.) was coated on a silicone wafer using a spinner and then dried by baking on a hot plate at 205° C. for 60 seconds to form an organic antireflective film having a thickness of 77 nm. Subsequently, the resist composition was coated on the antireflective film using a spinner and dried by prebaking on a hot plate at 130° C. for 90 seconds to form a resist film having a thickness of 225 nm on the antireflective film.

A protective film material prepared by dissolving 100 parts by mass of a copolymer (k:la:lb:m=30:10:20:40 (mol %)) having a constituent unit represented by the chemical formula (3), and 10 parts by mass of $C_{10}F_{21}COOH$ in 2-methyl-1-propylalcohol, so as to adjust the concentration of the solid to 2.5%. The material thus prepared was spin-coated on the resist film, and then heated at 90° C. for 60 seconds to form a protective film having a thickness of 70.0 nm.

Then, the resist film was irradiated with pattern light (exposure) through a mask pattern by an aligner Nikon-S302A (manufactured by Nikon Corporation) using ArF excimer laser (wavelength: 193 nm). In a liquid immersion lithography treatment, pure water was continuously dripped at 23° C. on the resist film for 1 minute while rotating the exposed silicone wafer on which the resist film was formed. The process of this portion is a process of exposing in a completely immersed state in an actual production process. Since it is theoretically guaranteed to completely conduct the exposure in an optical system based on analysis of the abovementioned liquid immersion lithography method, the present invention has such a simple constitution that, first, the resist film is exposed, and then pure water as a refractive index liquid (immersion liquid) is loaded on a resist film after the exposure so that only an influence of the immersion liquid on the resist film can be evaluated.

After the process of dropping pure water, a PEB treatment was conducted at 115° C. for 90 seconds. After this PEB treatment, the rest film was allowed to stand under circumstance without amine filter for 15 minutes and then allowed to stand in an exposure room for 20 minutes. The conditions of this standing treatment corresponds to the state in which the rest film was allowed to stand under a conventional environmental atmosphere (the concentration of amine is from 2 to 4 ppm) for 60 minutes. After this standing treatment, the rest film was developed with an alkaline developing solution at 23° C. for 60 seconds without removing the protective film. As the alkaline developing solution, an aqueous 2.38 mass % tetramethylammonium hydroxide solution was used. The protective film was completely removed by this development process and the development of the resist film could be satisfactorily realized.

The resulting resist pattern (1:1 line-and-space of 130 nm) was observed by a scanning electron microscope (SEM) and found that a pattern profile has a good rectangular shape.

The substrate, on which pure water was dripped after exposure, was allowed to stand in an atmosphere having an amine concentration of 2.0 ppb for 60 minutes, and subjected to the same development treatment as that described above, and then a resist pattern shape was observed in the same manner. As a result, there was not a large difference with the pattern profile.

Example 3

Using the resist composition used in Example 2, a resist film having a thickness of 225 nm was formed in the same manner as described above. Furthermore, a protective film having a thickness of 140 nm was formed in the same manner as described above, using the same protective film material as that used in Example 2.

Using an aligner for liquid immersion lithography manufactured by ASML Co. (name of testing apparatus: ASML AT:1150i), a liquid immersion lithography treatment was conducted. Then, a PEB treatment was conducted at 115° C. for 90 seconds, and a development treatment was conducted at 23° C. for 60 seconds using an aqueous 2.38 mass % TMAH solution. The protective film was completely removed by this development process and the development of the resist film could be satisfactorily realized.

The resulting resist pattern (1:1 line-and-space of 90 nm) was observed by a scanning electron microscope (SEM) and found that a pattern profile has a good rectangular shape.

Comparative Example 1

Using the positive photoresist shown in Example 2, a resist pattern (1:1 line-and-space of 1300 nm) was formed by the very same means, except that no protective film was formed, after standing in an atmosphere having an amine concentration of 2.0 ppb for 60 minutes, and then observed by a scanning electron microscope (SEM). As a result, an adverse influence (T-top shape) on the pattern, which is considered to be caused by deactivation of an acid.

INDUSTRIAL APPLICABILITY

As described above, according to the present invention, even if a resist film is formed using a common resist composition, it is possible to obtain a highly accurate resist pattern which is free from surface roughness, such as a resist pattern with a T-top shape, having high sensitivity and excellent resist pattern profile, and also being excellent in depth of focus, exposure latitude and post exposure delay stability, regardless of the type of immersion liquid used, and particularly water or a fluorine-based medium used in a liquid immersion lithography process. Consequently, when using a protective film of the present invention, a resist pattern can be effectively formed using a liquid immersion lithography process. Furthermore, the material of the present invention can form a protective film having a high refractive index, which until now has never been achieved before, and therefore can also be effectively used for a high refractive index liquid immersion medium. In addition, it is possible to further improve the pattern forming accuracy by liquid immersion lithography used in combination with a high refractive index liquid immersion medium, developed in the near future.

The invention claimed is:

1. A material for forming a protective film as an upper layer on a resist film, comprising at least an acrylic polymer, a solvent, and a fluorocarbon compound selected from the group consisting of general formula (6) and (7):

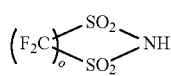
(6)

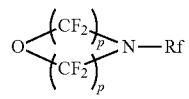
(7)

wherein o represents an integer of 2 to 3, p represents an integer of 2 to 3, and Rf represents an alkyl group in which a portion or all of hydrogen atoms are substituted with a fluorine atom, and may be substituted with a group selected from a hydroxyl group, an alkoxy group, a carboxyl group or an amino group, wherein the material is alkali-soluble.

2. The material according to claim 1, wherein the resist film is subjected to a liquid immersion lithography process.

3. The material according to claim 1, the acrylic polymer has at least a constituent unit represented by the following general formula (1):

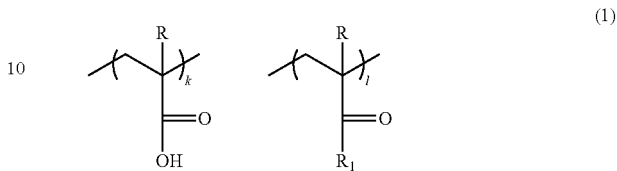
(1)

wherein R is selected from a hydrogen atom, a methyl group, and a hydroxyalkyl group having 1 to 5 carbon atoms; $R_1$ represents a hydrocarbon group having at least one alicyclic structure; and k and l each represent the content (mol %) of a constituent unit and is from 5 to 95 mol %, as the constituent unit.

4. The material according to claim 3, wherein $R_1$ in the general formula (1) is at least one hydrocarbon group selected from a hydroxyl group substituted or unsubstituted cyclohexyl group, adamantyl group, norbornyl group, isobornyl group, tricyclodecyl group and tetracyclododecyl group.

5. The material according to claim 4, wherein $R_1$ is selected from a tricyclodecyl group and a cyclohexyl group.

6. The material according to claim 3, wherein the acrylic polymer has at least a constituent unit represented by the following general formula (2):

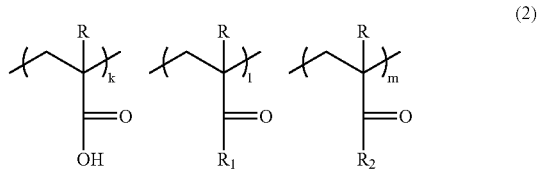
(2)

wherein R is selected from a hydrogen atom, a methyl group, and a hydroxyalkyl group having 1 to 5 carbon atoms; $R_1$ represents a hydrocarbon group having at least one alicyclic structure; $R_2$ represents a substituted or unsubstituted, branched or linear alkyl group having 1 to 5 carbon atoms; and k, l and m represent the content (mol %) of a constituent unit and are respectively from 5 to 50 mol %, which is obtained by adding a third constituent unit to a constituent unit represented by the general formula (1).

7. The material according to claim 6, wherein $R_2$ in the general formula (2) is at least one substituent selected from an alkyl group having 1 to 5 carbon atoms, and a hydroxyalkyl group.

8. The material according to claim 7, wherein $R_2$ is selected from an n-butyl group and an isobutyl group.

9. The material according to claim 1, wherein the acrylic polymer is dissolved in an alcoholic solvent.

10. The material according to claim 2, wherein the liquid immersion lithography process has a constitution such that the resolution of a resist pattern is improved by exposing the resist film to a liquid for liquid immersion lithography with a predetermined thickness, in which a refractive index is larger than that of air and smaller than that of the resist film, on at least the resist film in the path until lithography exposure light reaches the resist film.

11. The material according to claim 10, wherein the exposure light for exposing the resist film has a dominant wavelength which is at least one selected from 157 nm and 193 nm.

12. The material according to claim 1, wherein a base polymer of the resist composition constituting the resist film is composed of a (meth)acrylate ester unit.

13. The material according to claim 1, wherein a base polymer of the resist composition constituting the resist film has a constituent unit containing an acid anhydride of dicarboxylic acid.

14. The material according to claim 1, wherein a base polymer of the resist composition constituting the resist film has a phenolic hydroxyl group-containing constituent unit.

15. The material according to claim 1, wherein a base polymer of the resist composition constituting the resist film is a silsesquioxane resin.

16. The material according to claim 1, wherein a base polymer of the resist composition constituting the resist film has an α-(hydroxyalkyl)acrylic acid unit.

17. The material according to claim 1, wherein a base polymer of the resist composition constituting the resist film has a carboxylic acid monoester unit.

18. The material according to claim 1, wherein a base polymer of the resist composition constituting the resist film has an alkaline-soluble constituent unit including an aliphatic cyclic group which has (i) a fluorine atom or a fluorinated alkyl group, and (ii) an alcoholic hydroxyl group or an alkyloxy group.

19. The material according to claim 2, wherein the liquid for liquid immersion lithography is selected from the group consisting of water composed substantially of pure water and deionized water, a fluorine-based solvent, and a silica-based solvent.

20. A resist pattern forming method comprising a liquid immersion lithography process, comprising:
- forming a resist film on a substrate;
- forming a protective film on the resist film using the material for forming a resist protective film according to claim 1;
- directly disposing a liquid for the liquid immersion lithography having a predetermined thickness on at least the protective film of the substrate on which the resist film and the protective film are laminated;
- selectively irradiating the resist film via the liquid for liquid immersion lithography and the protective film, and optionally subjecting the film to a heat treatment; and
- developing the protective film and the resist film with an alkaline developing solution, thereby to remove the protective film and to obtain a resist pattern,
- wherein the material for forming a resist protective film is a material for forming a protective film as an upper layer on the resist film, comprising at least an acrylic polymer and a solvent, wherein the material is alkali-soluble.

* * * * *